(12) United States Patent
Takemoto (10) Patent No.: US 9,748,075 B2
(45) Date of Patent: Aug. 29, 2017

(54) APPARATUS FOR MANUFACTURING TEMPLATE AND METHOD FOR MANUFACTURING TEMPLATE

(71) Applicant: KABUSHIKI KAISHA TOSHIBA, Tokyo (JP)

(72) Inventor: Tetsuo Takemoto, Kanagawa-ken (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/225,491

(22) Filed: Aug. 1, 2016

(65) Prior Publication Data

US 2016/0343543 A1 Nov. 24, 2016

Related U.S. Application Data

(63) Continuation of application No. 13/595,111, filed on Aug. 27, 2012, now abandoned.

(30) Foreign Application Priority Data

Oct. 6, 2011 (JP) .................................. 2011-221841

(51) Int. Cl.
*C23C 14/34* (2006.01)
*H01J 37/32* (2006.01)

(52) U.S. Cl.
CPC ..... *H01J 37/3211* (2013.01); *H01J 37/32082* (2013.01); *H01J 37/32568* (2013.01); *H01J 37/32715* (2013.01); *H01J 37/32834* (2013.01); *H01J 2237/3341* (2013.01)

(58) Field of Classification Search
CPC ................ C23C 14/34; H01J 37/32082; H01J 37/32715; H05H 1/30

USPC ......... 156/345.1–345.55; 204/298.31–298.34
See application file for complete search history.

(56) References Cited

U.S. PATENT DOCUMENTS

| 5,091,208 | A | 2/1992 | Pryor |
| 5,215,619 | A | 6/1993 | Cheng et al. |
| 5,298,720 | A | 3/1994 | Cuomo |
| 5,529,657 | A | 6/1996 | Ishii |
| 5,986,874 | A | 11/1999 | Ross et al. |

(Continued)

FOREIGN PATENT DOCUMENTS

| JP | 2008-194980 | 8/2008 |
| JP | 2008-270686 | 11/2008 |

OTHER PUBLICATIONS

Office Action, issued by the Taiwan Intellectual Property Office on Feb. 21, 2014, for Taiwanese Patent Application No. 101130543, and English-language translation thereof.

(Continued)

*Primary Examiner* — Rodney McDonald
(74) *Attorney, Agent, or Firm* — Finnegan, Henderson, Farabow, Garrett & Dunner, L.L.P.

(57) ABSTRACT

According to one embodiment, an apparatus for manufacturing a template includes a vacuum chamber, an electrode and an adjustor. The vacuum chamber includes an inlet and an exhaust port of a reactive gas. The vacuum chamber is capable of maintaining an atmosphere depressurized below atmospheric pressure. The electrode is provided in an interior of the vacuum chamber. A high frequency voltage is applied to the electrode. A substrate is placed on the electrode. The substrate has a back surface on a side of the electrode. A recess is provided in the back surface. The adjustor is inserted into the recess. The adjustor is insulative.

25 Claims, 8 Drawing Sheets

(56) References Cited

U.S. PATENT DOCUMENTS

| | | |
|---|---|---|
| 6,221,200 B1 | 4/2001 | Saito |
| 6,280,646 B1 | 8/2001 | Stocks |
| 6,308,654 B1 | 10/2001 | Schneider et al. |
| 2004/0173319 A1 | 9/2004 | Suzuki |
| 2005/0212156 A1 | 9/2005 | Tokita et al. |

OTHER PUBLICATIONS

Notification of Comments, issued by the Korean Intellectual Property Office on Jul. 31, 2013, for Korean Patent Application No. 10-2012-94618, and English-language translation thereof.

APPARATUS FOR MANUFACTURING TEMPLATE AND METHOD FOR MANUFACTURING TEMPLATE

CROSS-REFERENCE TO RELATED APPLICATIONS

This is a continuation of U.S. patent application Ser. No. 13/595,111, filed Aug. 27, 2012, which is based upon and claims the benefit of priority from the prior Japanese Patent Application No. 2011-221841, filed on Oct. 6, 2011; the entire contents of both of which are incorporated herein by reference.

FIELD

Embodiments described herein relate generally to an apparatus for manufacturing a template and a method for manufacturing the template.

Technology for forming fine patterns has been applied to various devices such as electronic devices of semiconductors and the like, optical devices, storage media, chemical/bio devices, MEMS (Mechanical Electrical Micro Systems), etc., with remarkable progress. For example, currently, pattern formation has been achieved for a resist pattern of several tens of nm or less using light and for a resist pattern of 10 nm or less using an electron beam. However, the apparatuses for forming such fine patterns are expensive; and inexpensive technology for forming fine patterns is desirable. To realize this, nanoimprint technology is being developed.

Compared to conventional press technology, nanoimprint technology can realize a more micro structure. There is no limit on the resolution of nanoimprint technology itself; and the resolution is determined by the precision of the mold (the template) used in the nanoimprinting. In other words, by realizing a mold having high precision, an ultra-fine pattern can be formed more easily than with conventional photolithography and can be formed using apparatuses that are much more inexpensive than those of conventional photolithography.

For example, photocured nanoimprinting is one nanoimprint technology that uses a template made of a transparent substrate including a concavity and convexity pattern having a fine three-dimensional configuration formed in the front surface of the transparent substrate. In this method, for example, the desired pattern is formed in a photocurable resin by coating the photocurable resin onto a silicon substrate, curing the photocurable resin by irradiating ultraviolet light in a state in which the front surface of a nanoimprint template is pressed onto the photocurable resin, and by subsequently peeling the nanoimprint template.

Also, thermal nanoimprinting, soft lithography, and the like are other methods of nanoimprint technology in which the pattern is transferred by pressing the nanoimprint template onto a resin as recited above.

When applying nanoimprint technology to mass production, a replica template (called simply a template herein) that is constructed from a master template is used as the nanoimprint template. In the template, there are cases where a recess is provided in a portion of the back surface on the side opposite to the surface on the front side where the concavity and convexity pattern having the fine three-dimensional configuration is formed. In other words, because the recess is provided in, for example, the central portion of the back surface of the template substrate and the thickness at the recess is thinner than the peripheral portion, the template substrate deforms easily; the process of pressing the template onto the photocurable resin (the pattern transfer process) and the process of peeling the template recited above can be easier; and as a result, the throughput can be increased.

Although dry etching is used to form the concavity and convexity pattern which has the fine three-dimensional configuration in the surface on the front side of the template, differences in the plasma potential occur in the dry etching according to the existence or absence of the recess in the case where the recess is provided in a portion of the back surface of the template. Thereby, the etching rate fluctuates. Therefore, the precision in the surface degrades when etching the surface on the front side of the template.

Further, technology is desired, for example, to realize a pattern having higher precision in desired portions of the surface by changing the etching rate in the surface of the template.

DETAILED DESCRIPTION

According to one embodiment, an apparatus for manufacturing a template includes a vacuum chamber, an electrode and an adjustor. The vacuum chamber includes an inlet and an exhaust port of a reactive gas. The vacuum chamber is capable of maintaining an atmosphere depressurized below an atmospheric pressure. The electrode is provided in an interior of the vacuum chamber. A high frequency voltage is applied to the electrode. A substrate is placed on the electrode. The substrate has a back surface on a side of the electrode. A recess is provided in the back surface. The adjustor is configured to be inserted into the recess. The adjustor is insulative.

According to one embodiment, a method is disclosed for manufacturing a template. The method can include disposing a substrate used to form a template on an electrode with a back surface of the substrate opposing the electrode. A high frequency voltage is applied to the electrode. The substrate has a patterning surface on a front surface and a recess in the back surface. The method can include performing dry etching of the patterning surface in a state in which an adjustor is inserted into an interior of the recess. The adjustor is insulative.

Various embodiments will be described hereinafter with reference to the accompanying drawings.

The drawings are schematic or conceptual; and the relationships between the thicknesses and the widths of portions, the proportional coefficients of the sizes between portions, etc., are not necessarily the same as the actual values thereof. Further, the dimensions and/or the proportional coefficients may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1:
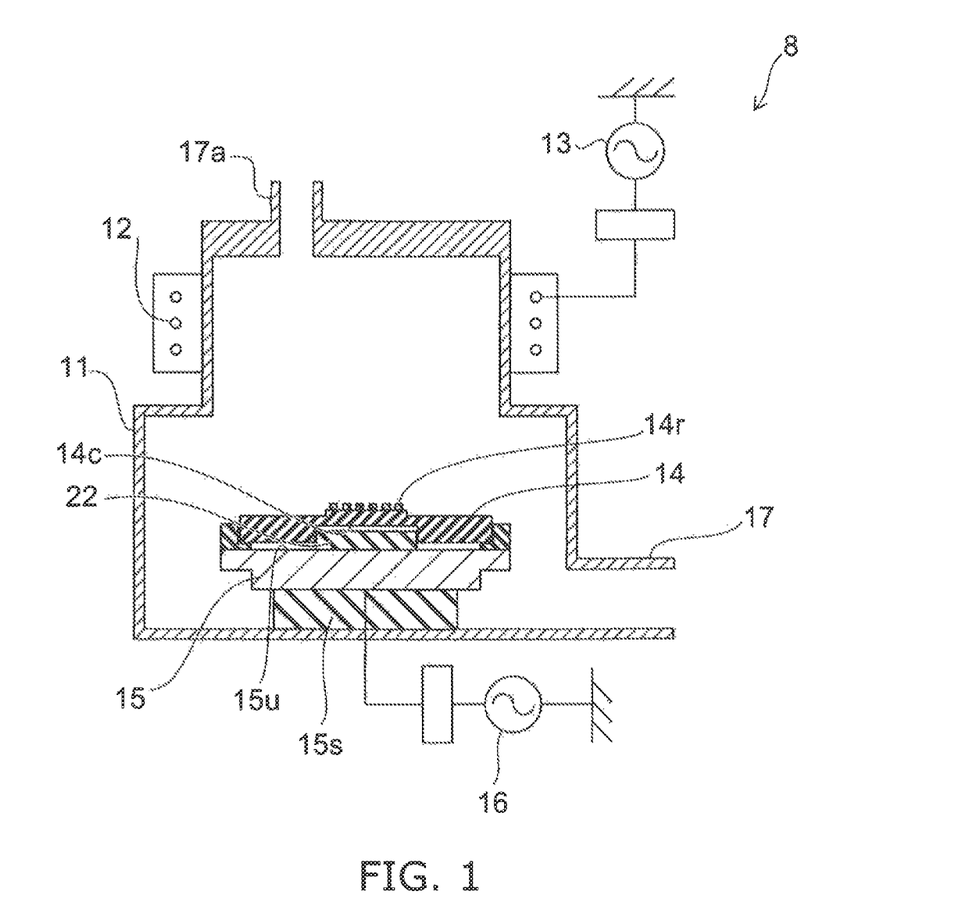
FIG. 1 is a schematic cross-sectional view illustrating an apparatus for manufacturing a template according to a first embodiment.

FIG. 1 is a schematic cross-sectional view illustrating an apparatus for manufacturing a template according to a first embodiment.

As shown in FIG. 1, the apparatus 8 for manufacturing the template according to the embodiment includes a vacuum chamber 11, an electrode 15, and an adjustor 22.

The vacuum chamber 11 is capable of maintaining an atmosphere depressurized below atmospheric pressure. For example, the vacuum chamber 11 has a gas inlet 17a configured to introduce a reactive gas, and an exhaust port 17.

The reactive gas is introduced to the vacuum chamber 11; and a constant pressure control is performed. In other words, the gas inlet 17a is provided in the vacuum chamber 11; and the prescribed gas can be introduced to the vacuum chamber 11. A vacuum pump, etc., is connected to the exhaust port 17 provided in the vacuum chamber 11.

Thereby, the prescribed gas is introduced to the vacuum chamber 11; and the pressure inside the vacuum chamber 11 is controlled to have the desired value by the gas inside the vacuum chamber 11 being evacuated through the exhaust port 17.

The electrode 15 is provided in the interior of the vacuum chamber 11. The electrode 15 is provided, for example, in the interior of the vacuum chamber 11 on, for example, an insulative stage 15s. A substrate 14 used to form the template is placed on the electrode 15.

A biasing high frequency power supply 16 (a high frequency power supply) is connected to the electrode 15. Thereby, a high frequency voltage (a bias voltage) is applied to the electrode 15. As a result, a bias electric field is applied to the substrate 14 placed on the electrode 15.

The manufacturing apparatus 8 of the specific example is an inductively coupled plasma etching apparatus (an inductively coupled plasma etching system); and an ICP (inductively coupled plasma) high frequency coil 12 is provided as an inductively coupled plasma source in the vacuum chamber 11 above the electrode 15. The ICP high frequency coil 12 is connected to an ICP high frequency power supply 13.

Plasma is generated inside the vacuum chamber 11 by the ICR high frequency voltage applied to the ICP high frequency coil 12; and active species inside the plasma are accelerated by the bias voltage applied to the electrode 15. Thereby, the front surface of the substrate 14 is etched. The ICP high frequency coil 12 is an inductively coupled antenna and may be a coil having a helical configuration or a coil having a flat plate configuration.

The embodiment is not limited thereto. Other than the form using the inductively coupled plasma etching apparatus, a form using a plasma etching apparatus that uses reactive gas plasma and various forms using reactive ion etching (RIE) apparatuses (reactive ion etching systems) may be used. In this case, the ICP high frequency coil 12 and the ICR high frequency power supply 13 are not illustrated. In the case of, for example, a parallel plate-type RIE apparatus, a parallel-plate electrode is provided, for example, to oppose the electrode 15. Thus, in the embodiment, the configuration that generates the active species is arbitrary. The case will now be described where the manufacturing apparatus 8 is an inductively coupled plasma etching apparatus.

On the other hand, the substrate 14 which is to be patterned is placed on the electrode 15. The state of the placement of the electrode 15 is arbitrary. For example, as illustrated in FIG. 1, the substrate 14 is placed on the electrode 15; and the surface of the electrode 15 opposing the substrate 14 faces upward (opposite to the direction of gravity) in this case. However, the surface of the electrode 15 opposing the substrate 14 may be provided along the direction of gravity, may be provided facing downward (the direction of gravity), or may be along a direction between these directions.

In other words, although the substrate 14 is placed "on" the electrode 15, "on" in this case is not limited to meaning the upward direction corresponding to gravity; and it is sufficient for the substrate 14 to be placed such that the electrode 15 and the substrate 14 oppose each other.

Hereinbelow, the case illustrated in FIG. 1 will be described where the substrate 14 is placed on the electrode 15, and the surface of the electrode 15 opposing the substrate 14 faces upward, that is, where the substrate 14 is placed on an upper surface 15u of the electrode 15.

The manufacturing of the template using the manufacturing apparatus 8 may be performed, for example, as follows.

First, the substrate 14 used to form the template is placed on the electrode 15 inside the vacuum chamber 11.

The substrate 14 may include, for example, quartz ($SiO_2$). Then, a resist 14r including a pattern having a prescribed configuration is formed on the substrate 14. The resist 14r may include, for example, a photocurable resin resist pattern cured by irradiating ultraviolet light. In other words, a portion of the front surface of the substrate 14 is covered with the resist 14r including the prescribed pattern; and the other portion of the front surface of the substrate 14 is exposed. This surface on which the resist 14r is provided is the surface on the front side of the substrate 14 and is used as the patterning surface.

Continuing, the reactive gas is introduced through the gas inlet 17a provided in the vacuum chamber 11; the flow of the gas inside the vacuum chamber 11 is made to be uniform in an unbiased state; and the interior of the vacuum chamber 11 is caused to have the prescribed pressure by evacuating the gas inside the vacuum chamber 11 through the exhaust port 17.

Then, a high frequency wave is applied to the ICR high frequency coil 12 by the ICR high frequency power supply 13. Thereby, a high-density plasma is generated by exciting the reactive gas to generate the active species necessary for the etching (including ions and/or radicals).

The energy of the ions and the radicals incident on the substrate 14 is controlled by a bias voltage applied to the electrode 15 by the biasing high frequency power supply 16.

Thereby, the front surface of the substrate 14 exposed from the resist 14r is selectively etched; and a concavity and convexity pattern having the desired fine three-dimensional configuration is formed in the front surface of the substrate 14.

For example, a gas mixture of a fluorine-based gas and an oxygen gas is used as the reactive gas.

In such a case, a recess 14c is provided in the back surface (the surface on the side opposite to the surface on the front side where the resist 14r is provided) of the substrate 14 used in the manufacturing apparatus 8 according to the embodiment; and the adjustor 22 having a protruding configuration is provided on the electrode 15 to correspond to the recess 14c. An insulator is a main component of the adjustor 22. The adjustor 22 is insulative. The adjustor 22 is inserted into the recess provided in the electrode 15—side surface of the substrate 14 placed on the electrode 15. This configuration will now be described in detail.

Figure 2A:
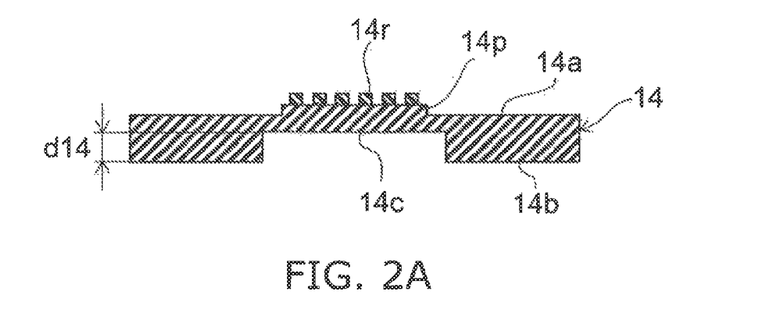
FIGS. 2A to 2C are schematic cross-sectional views illustrating one main component of the apparatus for manufacturing the template according to the first embodiment.
Figure 2B:
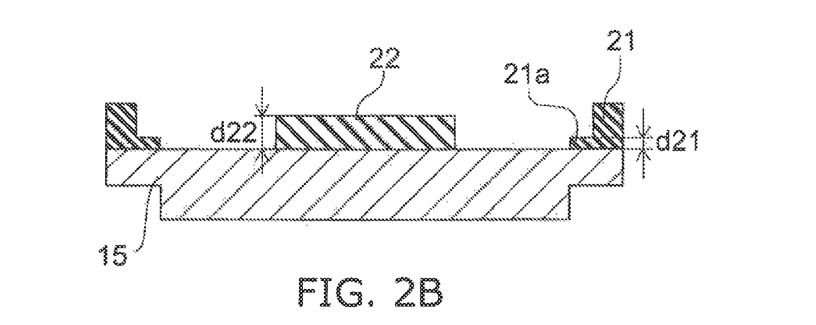
Figure 2C:
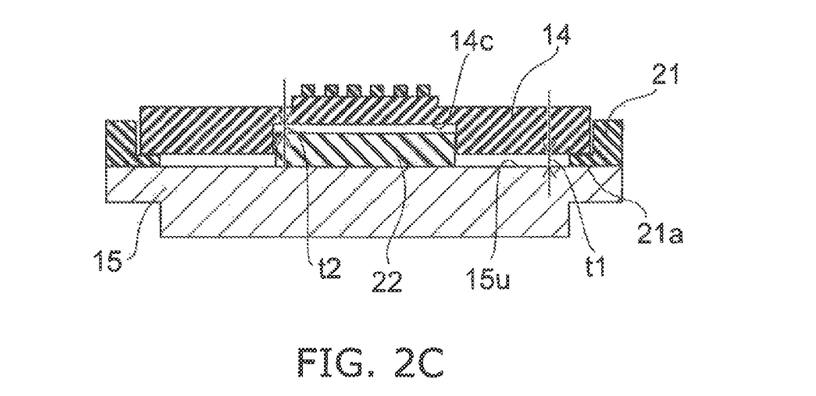

FIGS. 2A to 2C are schematic cross-sectional views illustrating one main component of the apparatus for manufacturing the template according to the first embodiment.

Namely, FIG. 2A illustrates the substrate 14 used to form the template applied in this manufacturing apparatus; FIG. 2B illustrates the electrode 15 of the manufacturing apparatus 8; and FIG. 2C illustrates the state in which the substrate 14 is placed on the electrode 15.

Figure 3:
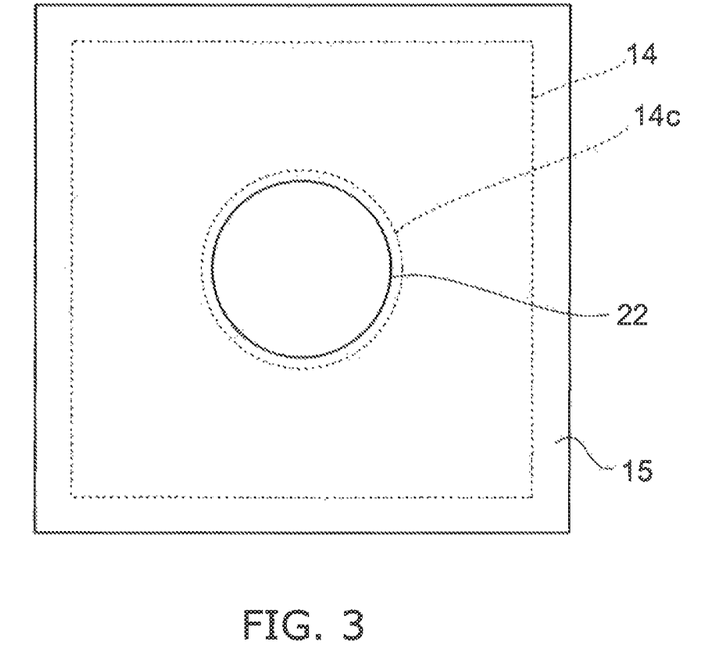
FIG. 3 is a schematic plan view illustrating the one main component of the apparatus for manufacturing the template according to the first embodiment.

FIG. 3 is a schematic plan view illustrating the one main component of the apparatus for manufacturing the template according to the first embodiment.

As shown in FIG. 2A, the resist 14r is provided on a surface 14a (the front surface) on the front side of the substrate 14 used to form the template. In the specific example, a protrusion 14p is provided in the central portion of the surface 14a on the front side; and the resist 14r is provided on the protrusion 14p. By the protrusion 14p, the subsequent pattern transfer can be performed efficiently when pressing the surface 14a on the front side of the substrate 14 onto a resin of a silicon substrate, etc. However, the protrusion 14p may be provided if necessary and may be omitted.

On the other hand, the recess 14c is provided in, for example, the central portion of a back surface 14b on the side of the substrate 14 opposite to the surface 14a on the front side.

The recess 14c has a depth d14. The depth d14 is the distance between the back surface 14b of the substrate 14 and the bottom surface of the recess 14c.

As shown in FIG. 3, the planar configuration of the substrate 14 is, for example, a rectangle; and the planar configuration of the recess 14c is, for example, a circle. However, FIG. 3 is an example; and the embodiment is not limited thereto. In other words, the configurations of the substrate 14 and the recess 14c are arbitrary. For example, the substrate 14 may be a circle (or a portion of a circle); and the configuration of the recess 14c may be a rectangle. Also, the relative size of the recess 14c with respect to the size of the substrate 14 is arbitrary.

By such a recess 14c, for example, the substrate 14 deforms easily; the pattern transfer process using the template and the peeling process of the template can be easier; and as a result, the throughput can be increased.

The recess 14c can be made by etching the back surface 14b of the substrate 14 by, for example, forming an appropriate mask. Wet etching, dry etching, mechanical polishing, or a combination of these methods may be used to make the recess 14c.

The size of the substrate 14 is, for example, 6 inches by 6 inches; the thickness of the substrate 14 is, for example, 5 mm to 5 mm; and the depth d14 of the recess 14c is, for example, 4 mm to 5 mm. The thickness of the substrate 14 at the recess 14c is, for example, about 1 mm.

However, the sizes recited above are examples; and the embodiment is not limited thereto. In other words, the size and the thickness of the substrate 14, the depth d14 of the recess 14c, and the thickness of the substrate 14 at the recess 14c are arbitrary. To simplify the description hereinbelow, the case will be described where the thickness of the substrate 14 is 5 mm, the depth d14 of the recess 14c is 4 mm, and the thickness of the substrate 14 at the recess 14c is 1 mm.

On the other hand, as shown in FIG. 2B, the adjustor 22 (the cover bridge plate) that adjusts the gap between the bottom surface of the recess 14c and the upper surface 15u of the electrode 15 is provided on the surface of the electrode 15 on which the substrate 14 is placed. The adjustor 22 protrudes from the upper surface 15u of the electrode 15 and has a configuration corresponding to the recess 14c of the substrate 14.

In other words, as shown in FIG. 3, in the case where the recess 14c is a circle, the adjustor 22 also is, for example, a circle; and the adjustor 22 has a configuration such that at least a portion of the adjustor 22 can enter the interior of the recess 14c of the substrate 14.

The adjustor 22 may include, for example, an insulating material. Further, the adjustor 22 may include, for example, the same material as the substrate 14 (e.g., $SiO_2$). Thereby, the adjustor 22 can have the same electrical characteristics as the substrate 14; and it becomes easier to realize the suppression effect of the fluctuation of the potential described below. However, the embodiment is not limited thereto. The adjustor 22 may include, for example, a titania ($TiO_2$)-containing quart material. The adjustor 22 may include any insulator (including a dielectric). Because the adjustor 22 is placed in an atmosphere having a high vacuum, it is favorable for a material that does not easily emit gas in a vacuum to be used as the adjustor 22.

To fix the position of the adjustor 22 when disposing the adjustor 22 on the electrode 15, the relative positions of the adjustor 22 and the electrode 15 may be fixed by providing a recess such as a trench, a hole, etc., in the electrode 15 and by providing a protrusion corresponding to the recess on the surface of the adjustor 22 opposing the electrode 15. The protrusion may be the configuration of the adjustor 22 itself. Conversely, the relative positions of the adjustor 22 and the electrode 15 may be fixed by providing a protrusion on the electrode 15 and by providing a recess corresponding to the protrusion in the surface of the adjustor 22 opposing the electrode 15. Also, various fixing jigs such as screws, etc., may be used to fix the adjustor 22 to the electrode 15.

The adjustor 22 has a height d22. The height d22 is the distance between the upper surface 15u of the electrode 15 and the surface of the upper side of the adjustor 22.

In the specific example as shown in FIG. 2B, a guide plate 21 that guides the substrate 14 is provided on the peripheral portion of the upper surface 15u (the surface on which the substrate 14 is placed) of the electrode 15. Although the guide plate 21 may include any material, it is desirable for an insulating material to be used to avoid affecting the distribution of the potential at the front surface of the substrate 14. For example, the guide plate 21 may include the material of the substrate 14 (e.g., $SiO_2$). For example, the guide plate 21 may include the material of the adjustor 22 (e.g., $SiO_2$). The guide plate 21 may include a titania ($TiO_2$)-containing quartz material. However, the embodiment is not limited thereto. The guide plate 21 may include any insulator (including a dielectric). Because the guide plate 21 is placed in an atmosphere having a high vacuum, it is favorable for a material that does not easily emit gas in a vacuum to be used as the guide plate 21.

A step-like portion 21a is provided in the guide plate 21. The step-like portion 21a has a difference in levels d21. The difference in levels d21 is the distance between the upper surface 15u of the electrode 15 and the surface of the upper side of the step-like portion 21a.

The difference in levels d21 is, for example, 0.15 mm to 0.20 mm. However, this is an example; and the embodiment is not limited thereto. The size of the difference in levels d21 is arbitrary. To simplify the description hereinbelow, the case is described where the difference in levels d21 is 0.15 mm.

When the substrate 14 is placed on the electrode 15 as shown in FIG. 2C, the end portion of the substrate 14 is guided by the guide plate 21 of the electrode 15; and the substrate 14 is disposed at the prescribed position on the electrode 15.

In such a case, the substrate 14 is disposed to be separated from the upper surface 15u of the electrode 15 by the step-like portion 21a of the guide plate 21. Thereby, scratches and dirt on the back surface 14b of the substrate 14 can be prevented because the portion of the back surface 14b of the substrate 14 other than the portion opposing the guide plate 21 does not contact the upper surface 15u of the electrode 15.

A distance t1 between the back surface 14b of the substrate 14 and the upper surface 15u of the electrode 15 is substantially the same as the difference in levels d21 of the step-like portion 21a of the guide plate 21. That is, the distance t1 can be controlled by the difference in levels d21.

The adjustor 22 of the electrode 15 enters the interior of the recess 14c of the substrate 14. In other words, for example, the side surface of the adjustor 22 of the electrode 15 has a configuration conforming to the inner surface of the recess 14c of the substrate 14; and at least a portion of the adjustor 22 is contained in the interior of the recess 14c.

In such a case, the depth d14 of the recess 14c is set to have an appropriate size with respect to the height d22 of the adjustor 22; and the bottom surface of the recess 14c can be separated from the upper surface of the adjustor 22. Thereby, scratches and dirt on the bottom surface of the recess 14c can be prevented because the bottom surface of the recess 14c of the substrate 14 does not contact the upper surface of the adjustor 22.

A distance t2 between the bottom surface of the recess 14c of the substrate 14 and the upper surface of the adjustor 22 is controlled by the difference in levels d21 of the step-like portion 21a, the depth d14 of the recess 14c, and the height d22 of the adjustor 22. In other words, even in the case where the difference in levels d21 of the step-like portion 21a (i.e., the distance t1) and the depth d14 of the recess 14c are fixed, the distance t2 can be set arbitrarily by changing the height d22 of the adjustor 22.

Here, because the distance t2 is d21+d14−d22, the height d22 of the adjustor 22 is set to be smaller than the sum of the difference in levels d21 and the depth d14 of the recess 14c. Then, for example, when setting the distance t2 to be the same as the distance t1, it is sufficient to set the height d22 of the adjustor 22 to be the same as the depth d14.

Thus, when the substrate 14 placed on the upper surface 15u of the electrode 15, the edge portion of the substrate 14 is supported by the step-like portion 21a of the guide plate 21; the back surface 14b of the substrate 14 is separated from the upper surface of the electrode 15; and the bottom surface of the recess 14c of the substrate 14 can be separated from the upper surface of the adjustor 22.

The distance t1 between the back surface 14b of the substrate 14 and the upper surface 15u of the electrode 15 can be determined independently from the distance t2 between the bottom surface of the recess 14c of the substrate 14 and the upper surface of the adjustor 22. Then, the distance t1 and the distance t2 can be substantially the same. Or, the distance t1 and the distance t2 may be set to be different from each other.

Thus, in the manufacturing apparatus 8 according to the embodiment, the distance t2 between the adjustor 22 and the bottom surface of the recess 14c of the substrate 14 can be adjusted by providing the adjustor 22 on the upper surface 15u of the electrode 15 to conform to the recess 14c provided in the back surface 14b of the substrate 14 which is to be patterned.

In other words, the adjustor 22 reduces the width of the gap on the electrode 15 side of the recess 14c of the substrate 14 to be less than the width when the adjustor 22 is not used (i.e., d21+d14), in the specific example, the width of the gap on the electrode 15 side of the recess 14c of the substrate 14 is reduced to be d21+d14−d22.

Thereby, even in the case where the recess 14c is provided in the back surface 14b of the substrate 14, the potential at the surface 14a on the front side of the substrate 14 can be substantially uniform regardless of being at a location where the recess 14c is made or at a location where the recess 14c is not made.

Thereby, the fluctuation of the potential when performing the dry etching of the surface 14a on the front side of the substrate 14 can be reduced; the etching rate of the dry etching can be uniform in the surface; and a template having high pattern precision can be manufactured.

Further, by arbitrarily adjusting the distance t2 between the adjustor 22 and the bottom surface of the recess 14c of the substrate 14, a pattern having higher precision can be realized at the desired portion in the surface by changing the etching rate in the surface of the substrata 14 by controlling the distribution of the potential at the surface 14a on the front side of the substrate 14.

An example in which the fluctuation of the potential is reduced and the etching rate of the dry etching is uniform in the surface when performing the dry etching of the surface 14a on the front side of the substrate 14 will now be described in more detail. An example will be described in which the distance t2 between the adjustor 22 and the bottom surface of the recess 14c of the substrate 14 is set to have the same value as the distance t1 between the back surface 14b of the substrate 14 and the upper surface 15u of the electrode 15.

FIGS. 4A to 4D are schematic views illustrating characteristics of the apparatus for manufacturing the template according to the first embodiment.

Figure 4A:
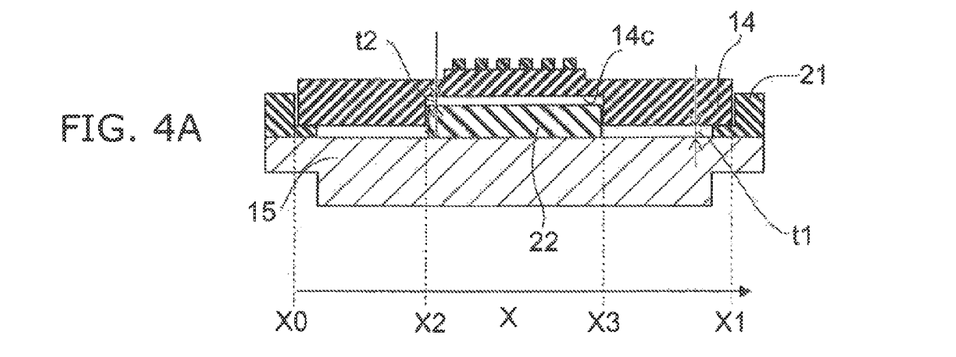
FIGS. 4A to 4D are schematic views illustrating characteristics of the apparatus for manufacturing the template according to the first embodiment.
Figure 4B:
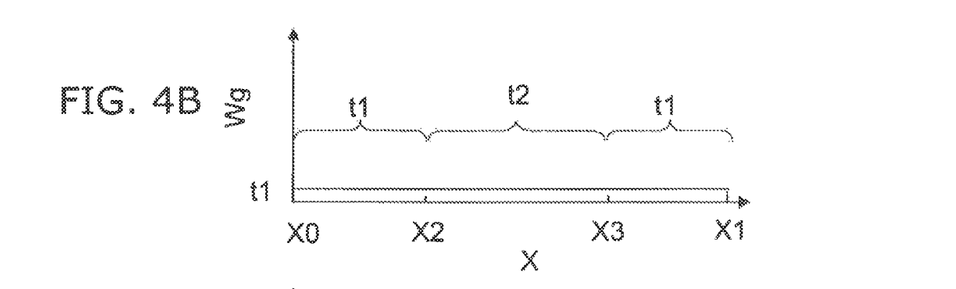
Figure 4C:
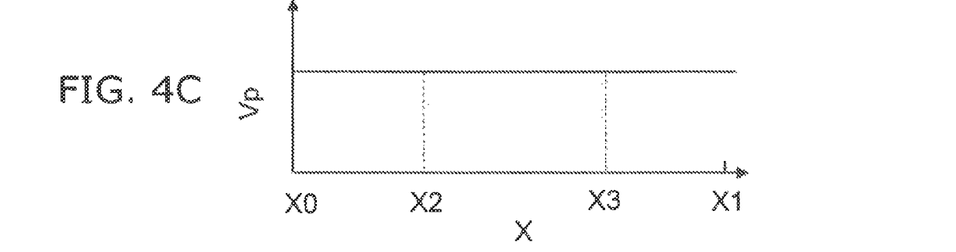

Namely, FIG. 4A illustrates the coordinates of the electrode 15 and the substrate 14; FIG. 4B illustrates the distribution of the width of the gap between the electrode 15 and the substrate 14 and between the adjustor 22 and the substrate 14; FIG. 4C illustrates the distribution of the potential at the surface 14a on the front side of the substrate 14; and FIG. 4D illustrates the distribution of the etching rate of the surface 14a on the front side of the substrate 14.

As shown in FIG. 4A, one direction parallel to the surface 14a on the front side of the substrate 14 is taken as an X axis. For example, the X axis is one direction in a plane parallel to the upper surface 15u of the electrode 15. A position X0 is the X-axis position of an end of the substrate 14; a position X1 is the X-axis position of the other end of the substrate 14; a position X2 is the X-axis position of the end of the recess 14c proximal to the position X0; and a position X3 is the X-axis position of the other end of the recess 14c.

Figure 4D:
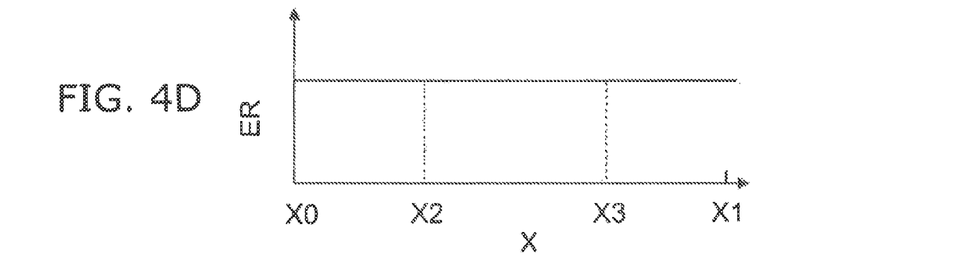

In FIGS. 4B, 4C, and 4D, the horizontal axis indicates the position X; and the vertical axis indicates a width Wg of the gap between the electrode 15 and the substrate 14 and between the adjustor 22 and the substrate 14, a potential Vp of the surface 14a on the front side of the substrate 14, and an etching rate ER of the surface 14a on the front side of the substrate 14, respectively.

As shown in FIG. 4B, the width Wg of the gap between the electrode 15 and the substrate 14 and between the adjustor 22 and the substrate 14 is the distance t1 in the range in which the position X is X0 to X2 and X3 to X1, and is the distance t2 in the range in which the position X is X2 to X3. Because the distance t1 and the distance t2 are set to be the same in this example, the width Wg of the gap between the electrode 15 and the substrate 14 and between the adjustor 22 and the substrate 14 is constant.

Thereby, as shown in FIG. 4C, the potential Vp of the surface 14a on the front side of the substrate 14 is substantially constant; and the distribution of the potential Vp is uniform.

Thereby, as shown in FIG. 4D, the etching rate ER of the surface 14a on the front side of the substrate 14 is substantially constant; and the etching rate ER is uniform.

Figure 5A:
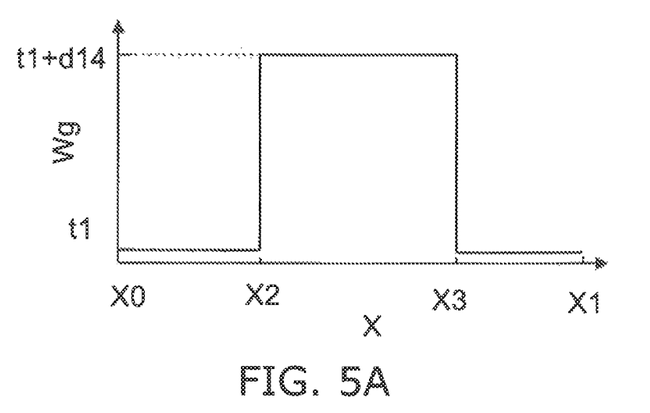
FIGS. 5A to 5C are schematic views illustrating the characteristics of the apparatus for manufacturing the template of a reference example.
Figure 5B:
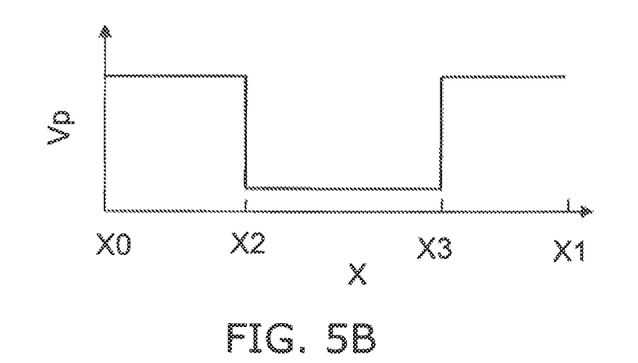
Figure 5C:
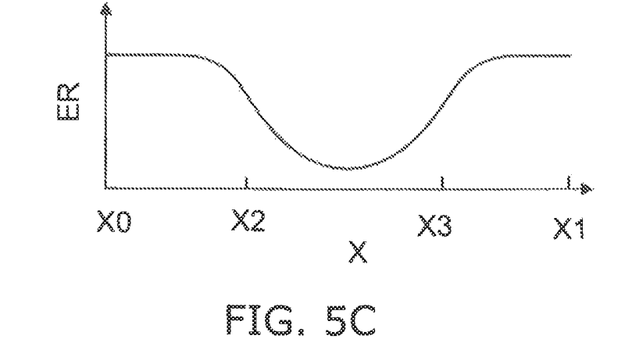

The characteristics of an apparatus for manufacturing a template of a reference example in which the adjustor 22 is not used will now be described in detail.

FIGS. 5A to 5C are schematic views illustrating the characteristics of the apparatus for manufacturing the template of the reference example.

Namely, FIGS. 5A, 5B, and 5C illustrate the distribution of the width Wg of the gap between the electrode 15 and the substrate 14, the distribution of the potential Vp of the surface 14a on the front side of the substrate 14, and the distribution of the etching rate ER of the surface 14a on the front side of the substrate 14, respectively.

Because the adjustor 22 is not provided in the apparatus for manufacturing the template of the reference example as shown in FIG. 5A, the width Wg of the gap between the electrode 15 and the substrate 14 is the distance t1 in the range in which the position X is X0 to X2 and X3 to X1 but is t1+d14 in the range in which the position X is X2 to X3. In other words, for example, the width Wg of the gap between the electrode 15 and the substrate 14 is 0.15 mm in the portion other than the recess 14c; and the width Wg is 4.15 mm at the recess 14c. Thus, in the case of the reference example, the width Wg of the gap changes greatly according to the existence or absence of the recess 14c.

Therefore, as shown in FIG. 5B, the potential Vp of the surface 14a on the front side of the substrate 14 changes greatly according to the position of the recess 14c.

As a result, as shown in FIG. 5C, the etching rate ER of the surface 14a on the front side of the substrate 14 changes greatly according to the position of the recess 14c; and as a result, the fluctuation of the size (including the depth and the height) increases for the concavity and convexity pattern which has the three-dimensional configuration formed by patterning the surface 14a on the front side of the substrata 14 exposed from the resist 14r.

Conversely, in the manufacturing apparatus 8 according to the embodiment as described above, the width Wg of the gap is constant by providing the adjustor 22 in the upper surface 15u of the electrode 15 to adjust the distance t2 between the adjustor 22 and the bottom surface of the recess 14c of the substrate 14. Thereby, the fluctuation of the potential when performing the dry etching of the surface 14a on the front side of the substrate 14 can be reduced; the etching rate of the dry etching can be uniform in the surface; and a template having high pattern precision can be manufactured.

Thereby, by using the manufacturing apparatus 8 according to the embodiment, excellent etching precision equivalent to that of an optical mask (a reticle) substrate used in normal optical lithography in which the recess is not provided in the back surface of the substrate 14 for the template that is etched can be obtained.

FIGS. 4A to 4D are model-like illustrations of the characteristics of the manufacturing apparatus 8 according to the embodiment; and, for example, it is not always necessary for the distributions of the potential Vp and the etching rate ER to be constant as illustrated in FIGS. 3C and 3D. In other words, generally, there is a difference in the density of the plasma between the central portion and the peripheral portion of the apparatus for a dry etching apparatus such as an inductively coupled plasma etching apparatus; and as a result, the density of the active species contributing to the etching has a planar distribution. Therefore, for example, the etching rate ER may have a planar distribution even in the case where a substrate is used in which the recess 14c is not provided in the back surface 14b.

Then, in the case of the substrate 14 in which the recess 14c is made in the back surface 14b, the fluctuation of the etching rate ER becomes extremely large because the width Wg of the gap between the substrate 14 and the electrode 15 greatly fluctuates due to the recess 14c as described in regard to the reference example recited above.

In the manufacturing apparatus 8 according to the embodiment, it is sufficient for the fluctuation of the etching rate ER to be suppressed; and it is not always necessary for the etching rate ER to be strictly uniform in the surface.

In other words, due to the recess 14c in the reference example, the width Wg of the gap between the substrate 14 and the electrode 15 fluctuates with a width of the distance t1 to (the distance t1+ the depth d14) (in this example, 0.15 mm to 4.15 mm). Conversely, in the manufacturing apparatus 8 according to the embodiment, it is sufficient for the width Wg of the gap between the substrate 14 and the electrode 15 to be narrower than the width of this fluctuation.

In the manufacturing apparatus 8 according to the embodiment, the distance t2 may not be the same as the distance t1; and, for example, the distance t2 may be set to be different from the distance t1 to compensate the planar distribution of the density of the active species contributing to the etching. As described above, the distance t2 can be set arbitrarily by changing the height d22 of the adjustor 22 even in the case where the difference in levels d21 of the step-like portion 21a (i.e., the distance t1) and the depth d14 of the recess 14c are fixed.

In other words, by changing the etching rate in the surface, a pattern having high precision can be patterned with a wide margin; simultaneously, the patterning of a portion having relatively low precision can be patterned with high productivity; and both high precision and high productivity can be realized as an entirety.

Figure 6A:
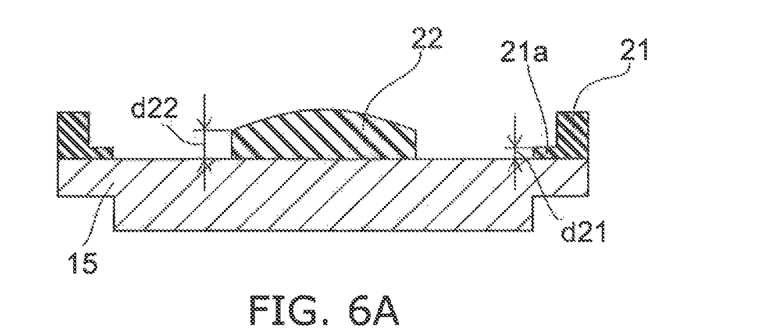
FIGS. 6A and 6B are schematic cross-sectional views illustrating main components of apparatuses for manufacturing templates of variations according to the first embodiment.
Figure 6B:
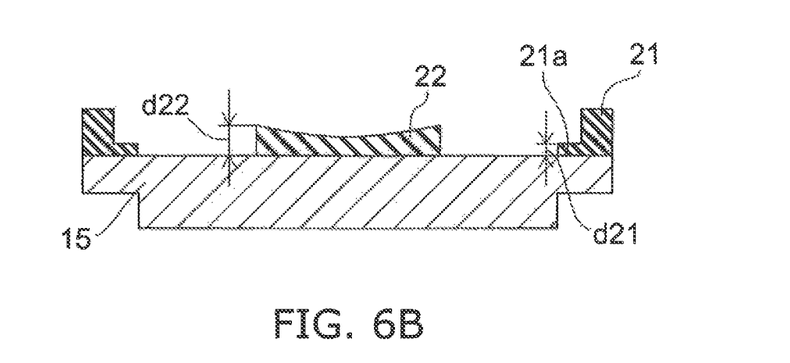

FIGS. 6A and 6B are schematic cross-sectional views illustrating main components of apparatuses for manufacturing templates of variations according to the first embodiment.

As shown in FIG. 6A, the height d22 of the adjustor 22 may be high at the central portion and low at the peripheral portion. In other words, the upper surface of the adjustor 22 has a convex lens configuration. In such a case, the width Wg of the gap between the substrate 14 and the electrode 15 (the gap between the recess 14c and the adjustor 22) is small at the central portion and large at the peripheral portion.

Also, as shown in FIG. 6B, the height d22 of the adjustor 22 may be low at the central portion and high at the peripheral portion. In other words, the upper surface of the adjustor 22 has a concave lens configuration. In such a case, the width Wg of the gap between the substrate 14 and the electrode 15 (the gap between the recess 14c and the adjustor 22) is large at the central portion and small at the peripheral portion.

Not only may the adjustor 22 have the configurations illustrated in FIGS. 6A and 6B, but also it is sufficient for a portion of the adjustor 22 to be contained in the interior of the recess 14c of the substrate 14; and the cross-sectional configuration of the adjustor 22 can be set arbitrarily.

FIGS. 7A to 7E are schematic plan views illustrating main components of apparatuses for manufacturing templates of variations according to the first embodiment.

In these drawings, the planar configurations of the substrate 14 and the recess 14c of the substrate 14 are illustrated together.

Figure 7A:
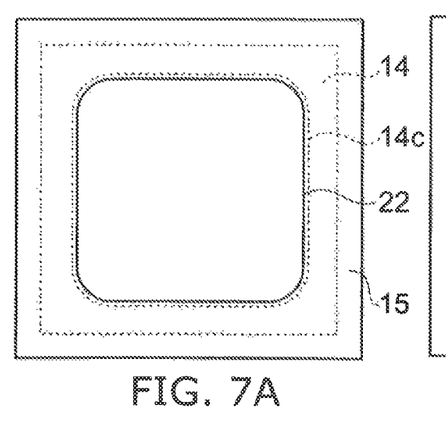
FIGS. 7A to 7E are schematic plan views illustrating main components of apparatuses for manufacturing templates of variations according to the first embodiment.

As shown in FIG. 7A, in the case where the planar configuration of the recess 14c of the substrate 14 is a rectangle having rounded corners, the planar configuration of the adjustor 22 may be a rectangle having rounded corners to correspond to the planar configuration of the recess 14c.

Figure 7B:
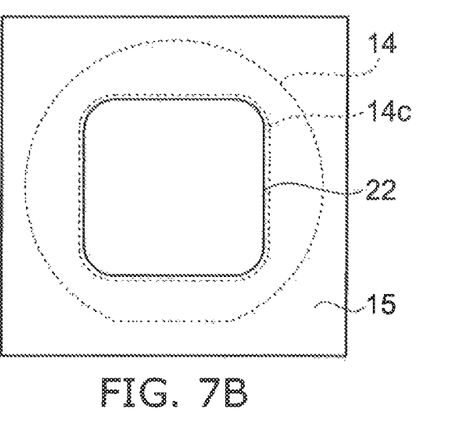

As shown in FIG. 7B, the planar configuration of the substrate 14 may be a circle having an orientation flat at a portion. In the specific example, the planar configuration of the recess 14c of the substrate 14 is a rectangle having rounded corners; and the planar configuration of the adjustor 22 is a rectangle having rounded corners to correspond to the planar configuration of the recess 14c.

Figure 7C:
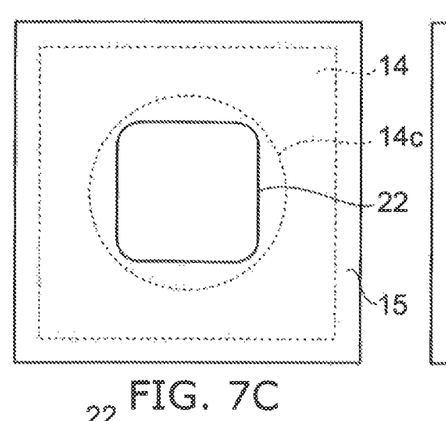

As shown in FIG. 7C, the planar configuration of the recess 14c of the substrate 14 is a circle; and the planar configuration of the adjustor 22 is a rectangle having rounded corners. In such a case, the width Wg of the gap between the recess 14c of the substrate 14 and the adjustor 22 is the distance t2 for the portion where the adjustor 22 is provided; and the width Wg of the gap between the recess 14c of the substrate 14 and the electrode 15 is the distance t1 plus the depth d14 for the recess 14c at the portion where the adjustor 22 is not provided.

Thus, the patterning precision of the surface 14a on the front side of the substrate 14 can be changed by location by the planar configuration of the recess 14c of the substrata 14 being different from the planar configuration of the adjustor 22 such that the etching rate ER of the surface 14a on the front side of the substrate 14 is different between the location where the adjustor 22 is provided and the location where the adjustor 22 is not provided. Then, this is utilized to pattern with higher precision in portions. In other words, the controllability of the patterning precision and the patterning time can be controlled with more degrees of freedom; and the patterning precision and the productivity can be increased.

The arbitrary setting of a height d11 of the adjustor 22 described in regard to FIGS. 6A and 6B may be implemented in combination with the arbitrary setting of the planar configuration of the adjustor 22 described in regard to FIG. 7C.

Figure 7D:
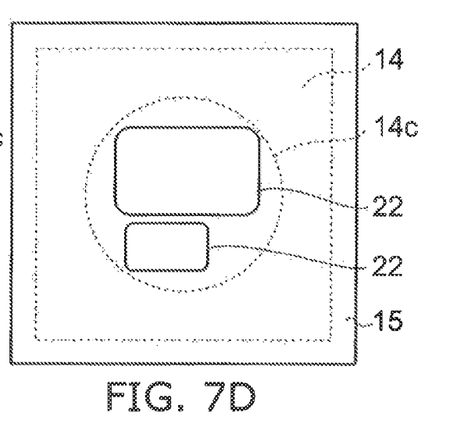

As shown in FIG. 7D, two adjusters 22 are provided to correspond to one recess 14c. Thus, multiple adjusters 22 are provided; and the multiple adjusters 22 may enter the one recess 14c.

Figure 7E:
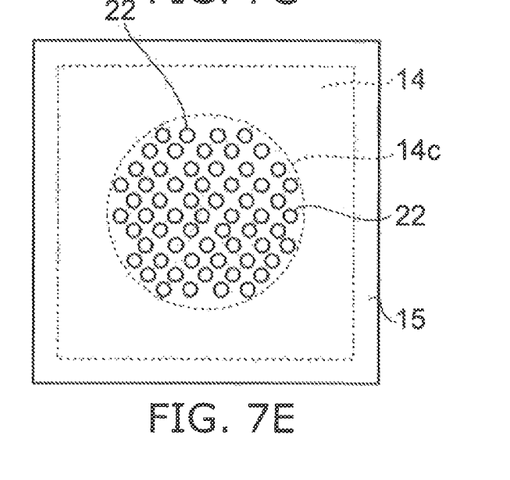

As shown in FIG. 7E, the planar configuration of the adjustor 22 (the configuration when projected onto a plane parallel to the upper surface 15u of the electrode 15) may be a dot configuration arranged two-dimensionally. By appropriately controlling the size of each dot and the density of the dots, effects that are substantially equivalent to those of the case where the planar configuration of the adjustor 22 is a single-body configuration can be realized. In other words, the width Wg of the gap between the recess 14c of the substrate 14 and the upper surface 15a of the electrode 15 can be controlled as a substantially single-body configuration. By the adjustor 22 being an aggregate of the dots as in the specific example, it is easier to control the configuration of the adjustor 22 to correspond to a recess 14c having any configuration by merely modifying a portion of the disposition of the dots. It is easier and convenient to control the potential Vp to have any configuration by controlling the configuration of the adjustor 22 to have any configuration.

Second Embodiment

Figure 8:
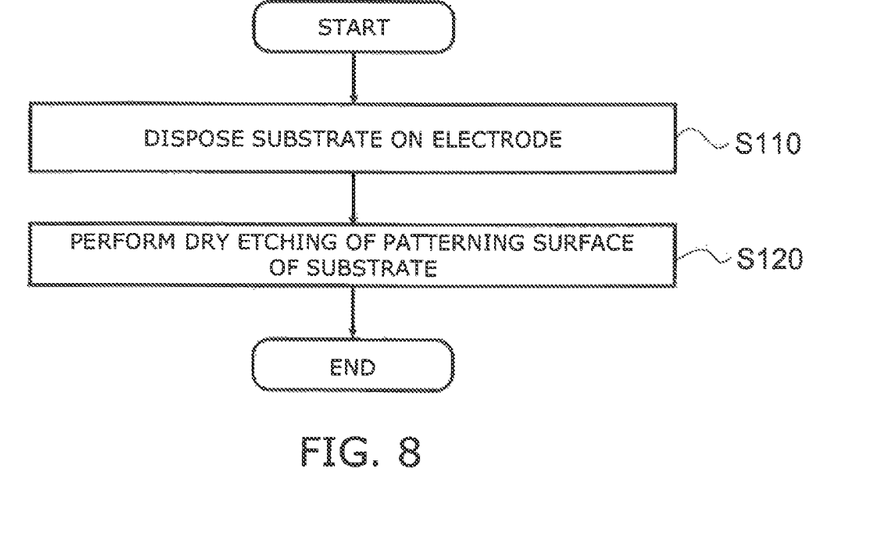
FIG. 8 is a flowchart illustrating a method for manufacturing a template of a modification according to a second embodiment.

FIG. 8 is a flowchart illustrating a method for manufacturing a template of a modification according to a second embodiment.

In the method for manufacturing the template according to the embodiment as shown in FIG. 8, the substrate 14 used to form the template is disposed on the electrode 15 to which a high frequency voltage is applied with the back surface of the substrate 14 opposing the electrode 15, where the substrate 14 has the patterning surface on the front surface (the surface 14a on the front side) end has the recess 14c in the back surface (step S110).

Then, dry etching of the patterning surface is performed in a state in which the adjustor 22 having a main component of an insulator is inserted into the interior of the recess 14c (step S120). The adjustor 22 is an insulator that adjusts the gap (the width Wg of the gap) between the recess 14c and the electrode 15.

For example, the manufacturing apparatus 8 described in the first embodiment can be used in this manufacturing method.

Thereby, even in the case where the recess is provided in the back surface of the substrate, the etching rate of the dry etching can be controlled in the surface; and a template having excellent pattern precision can be manufactured.

The side surface of the adjustor 22 recited above may be formed to conform to the Inner surface of the recess 14c. Thereby, the width Wg of the gap between the recess 14c and the electrode 15 can be efficiently controlled. Thereby, the potential can be efficiently controlled; and the distribution of the etching rate can be efficiently controlled.

According to the embodiment, the etching rate of the dry etching can be controlled in the surface even in the case where the recess is provided in the back surface of the substrate; and an apparatus for manufacturing a template and a method for manufacturing a template having excellent pattern precision can be provided.

Hereinabove, exemplary embodiments of the Invention are described with reference to specific examples. However, the invention is not limited to these specific examples. For example, one skilled in the art may similarly practice the invention by appropriately selecting specific configurations of components Included in apparatuses for manufacturing templates such as vacuum chambers, electrodes, biasing high frequency power supplies, exhaust ports, adjusters, etc., from known art; and such practice is included in the scope of the invention to the extent that similar effects are obtained.

Further, any two or more components of the specific examples may be combined within the extant of technical feasibility and are included in the scope of the invention to the extent that the purport of the invention is included.

Moreover; all apparatuses for manufacturing templates and methods for manufacturing templates practicable by an appropriate design modification by one skilled in the art based on the apparatuses for manufacturing templates and the methods for manufacturing templates described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An apparatus for manufacturing a template, comprising:
   a vacuum chamber including an inlet and an exhaust port of a reactive gas, the vacuum chamber being capable of maintaining an atmosphere depressurized below an atmospheric pressure;
   an electrode, provided in an interior of the vacuum chamber, for receiving a high frequency voltage to be applied thereto, a substrate to form the template being placed on the electrode, the substrate having a back surface on a side of the electrode, a recess being provided in the back surface;
   an adjustor being configured to be inserted into the recess, the adjustor being an insulator; and
   a guide plate provided in a peripheral portion of an upper surface of the electrode to guide the substrate, the guide plate being insulative;
   wherein
   a side surface of the adjustor conforms to an inner surface of the recess.

2. The apparatus according to claim 1, wherein at least one of the adjustor and the guide plate includes $SiO_2$.

3. The apparatus according to claim 1, wherein at least one of the adjustor and the guide plate includes quartz including $TiO_2$.

4. The apparatus according to claim 1, wherein the guide plate is formed of a same material as the adjustor.

5. The apparatus according to claim 1, wherein the guide plate has a step-like portion having a difference in levels.

6. The apparatus according to claim 5, wherein the difference in levels is not less than 0.15 mm and not more than 0.20 mm.

7. The apparatus according to claim 1, wherein the adjustor is provided in a plurality, and the plurality of adjustors are inserted into the recess.

8. The apparatus according to claim 1, wherein a configuration of the adjustor when projected onto a plane parallel to an upper surface of the electrode is a dot configuration arranged two-dimensionally in the plane.

9. The apparatus according to claim 1, further comprising an inductively coupled plasma high frequency coil additionally provided In the vacuum chamber above the electrode.

10. The apparatus according to claim 1, wherein the reactive gas includes at least one selected from a fluorine-based gas and an oxygen gas.

11. An apparatus for manufacturing a template using a substrate, comprising:
    a vacuum chamber including an inlet and an exhaust port of a reactive gas, the vacuum chamber being capable of maintaining an atmosphere depressurized below an atmospheric pressure;
    an electrode, provided In an interior of the vacuum chamber, for receiving a high frequency voltage to be applied thereto; and
    an adjustor provided on the electrode, the adjustor being an insulator, the adjustor having a constant thickness, the adjustor having an upper surface and a side surface, the upper surface and the side surface being exposed to the interior of the vacuum chamber, the adjustor being configured to be inserted in a recess of the substrate.

12. The apparatus according to claim 11, wherein the electrode has a first surface contacting the adjustor, and the first surface is wider than the upper surface of the adjustor.

13. The apparatus according to claim 11, wherein the adjustor has a lower surface, and all region of the lower surface contacts the electrode.

14. The apparatus according to claim 11, wherein the adjustor is formed of a same material as the substrate.

15. The apparatus according to claim 11, wherein the adjustor includes $SiO_2$.

16. The apparatus according to claim 11, wherein the adjustor includes quartz including $TiO_2$.

17. The apparatus according to claim 11, further comprising a guide plate provided in a peripheral portion of an upper surface of the electrode to guide the substrate, the guide plate being insulative.

18. The apparatus according to claim 1, wherein the adjustor is formed of a same material as the substrate.

19. The apparatus according to claim 1, wherein a configuration of the adjustor has a constant thickness.

20. The apparatus according to claim 1, wherein the adjustor is directly provided on the electrode.

21. The apparatus according to claim 1, wherein an upper surface of the adjustor is separated from a bottom surface of the recess.

22. The apparatus according to claim 11, wherein the adjustor is directly provided on the electrode.

23. The apparatus according to claim 11, wherein the upper surface of the adjustor is separated from a bottom surface of a substrate placed on the electrode.

24. The apparatus according to claim 1, wherein the substrate is a single piece.

25. The apparatus according to claim 1, wherein the adjustor has the same electrical characteristics as the substrate.

* * * * *